United States Patent [19]

Choi

[11] Patent Number: 5,581,582
[45] Date of Patent: Dec. 3, 1996

[54] AUTOMATIC FREQUENCY CONTROL METHOD AND APPARATUS THEREFOR

[75] Inventor: Yang-seok Choi, Kyungki-do, Rep. of Korea

[73] Assignee: Samsung Electronics Co., Ltd., Suwon, Rep. of Korea

[21] Appl. No.: 408,884

[22] Filed: Mar. 24, 1995

[30] Foreign Application Priority Data

Mar. 25, 1994 [KR]  Rep. of Korea ................... 94-6091

[51] Int. Cl.$^6$ ................................................ H04L 27/06
[52] U.S. Cl. .................. 375/344; 375/279; 375/326; 375/329; 329/307; 455/192.2
[58] Field of Search ....................... 375/279, 280, 375/281, 324, 326, 327, 331, 332, 344; 329/304, 307; 455/164.1, 164.2, 182.2, 192.2

[56] References Cited

U.S. PATENT DOCUMENTS

| 4,879,728 | 11/1989 | Tarallo | 375/80 |
| 4,896,336 | 1/1990 | Henely et al. | 375/80 |
| 4,943,982 | 7/1990 | O'Neil, II et al. | 375/81 |
| 5,241,567 | 8/1993 | Shimakata | 375/82 |
| 5,255,290 | 10/1993 | Anvari | 375/97 |
| 5,406,587 | 4/1995 | Herwitz et al. | 375/346 |

*Primary Examiner*—Stephen Chin
*Assistant Examiner*—Don Vo
*Attorney, Agent, or Firm*—Allen LeRoy Limberg

[57] ABSTRACT

An automatic frequency control apparatus includes a sampling portion for sampling the signal transmitted according to a phase-shift keying method, a phase difference detector for detecting the phase difference between the currently sampled signal and the immediately preceding sampled signal, and a phase bin comparator for determining which of a number of reference phases the phase of the transmitted signal is closest to, using a quantization characteristic of phase during transmission. The frequency offset generated by the distance between the frequency of a carrier wave and the local oscillation frequency of a receiver, or by the Doppler shift, in a MPSK communication method is determined as the phase difference between the detected phase difference information and the determined reference phase information. The apparatus can be used for the automatic frequency control of a modem using any type of MPSK modulation.

20 Claims, 5 Drawing Sheets

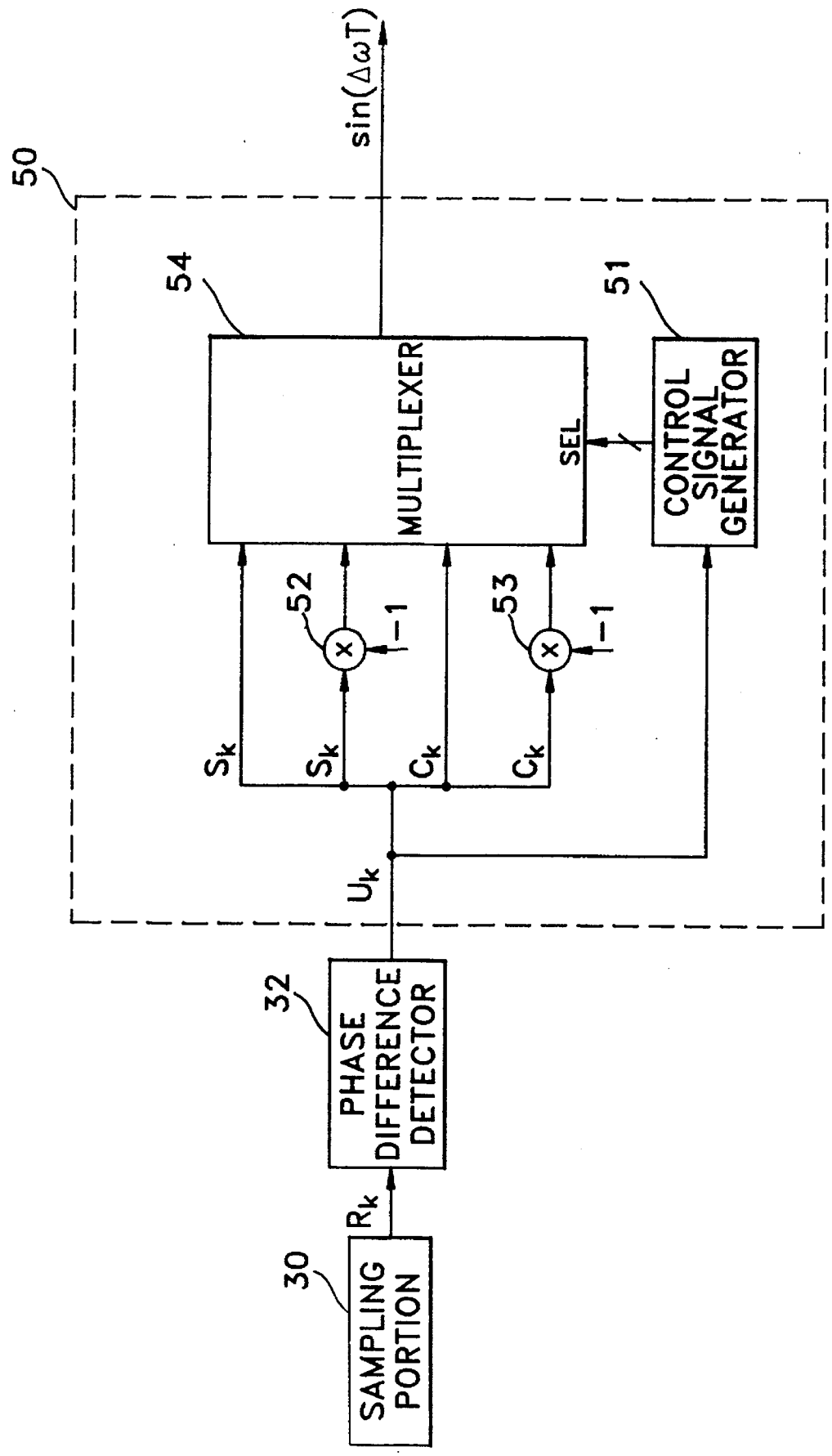

AUTOMATIC FREQUENCY CONTROL METHOD AND APPARATUS THEREFOR

The invention relates to an automatic frequency control (AFC) method and apparatus therefor, and more particularly, to an automatic frequency control method and apparatus therefor which are used to implement the detection of an M-ary phase-shift keying (MPSK) signal in a receiver for such signal.

BACKGROUND OF THE INVENTION

Detection of MPSK, including quaternary phase-shift keying or QPSK, is accomplished beginning with complex synchronous demodulation in which real (R) and imaginary (I) components of the MPSK are each synchronously detected. Thereafter, the MPSK receiver performs a symbol detection procedure. In order to synchronously demodulate the received signal, the oscillation frequency of the local carrier wave in the receiver has to match the frequency of the modulated carrier wave and no phase error should be present. As a result, the original signal can be perfectly detected by synchronous demodulation. To achieve this, a carrier wave generated within the receiver by a local oscillator (or beat-frequency oscillator) is synchronized with the suppressed carrier of the modulated signal. The conventional technology for synchronizing the carrier wave generated by the local oscillator with the suppressed carrier of the received signal will be described, referring to FIGS. 1, 2A and 2B.

FIG. 1 is a block diagram showing an automatic frequency control apparatus for conventional quadrature phase-shift keying (QPSK) demodulation. In FIG. 1, the received signal S(t) is supplied to multipliers 11 and 12. Multipliers 11 and 12 multiply the received signals by first and second local carrier waves which are supplied from a voltage-controlled oscillator (VCO) 19 and differ from each other in phase by 90°. Here, the first and second local carrier waves can be represented as $2\cos\omega_1 t$ and $2\sin\omega_1 t$, respectively.

The output signals of the multipliers 11 and 12 are low-pass filtered by low-pass filters (LPF) 13 and 14, respectively, to become baseband signals. When Gaussian noise is not included in the received signal, the received signal S(t) can be expressed as $A\cos[\omega_0 t+\phi(t)]$. The low-pass filter 13 responds to the output signal of the multiplier 11 to supply an I-channel (in-phase) signal I(t) expressed as $A\cos[\Delta\omega t+\phi(t)]$, and the low-pass filter 14 responds to the output signal of the multiplier 12 to supply a Q-channel (quadrature) signal Q(t) expressed as $A\sin[\Delta\omega t+\phi(t)]$. Here, $\Delta\omega=\omega_1-\omega_0$.

The responses of the low-pass filters 13 and 14 are digitized in analog-to-digital (A/D) converters 15 and 16, respectively, and the digitized signals are supplied as demodulated signals ($I_k$ and $Q_k$) to a frequency detector 17. The signals supplied from the A/D converters 15 and 16 each have a phase $\phi(t)$ that can change every symbol period $T_b$. For example, in quadrature phase-shift keying, phase $\phi(t)$ is 45°, 135°, −45° or −135° and varies according to the bit stream information supplied for transmission, the variation having a symbol period $T_b$. The frequency detector 17 generates frequency offset information V(k) responsive to the two channel signals, $I_k$ and $Q_k$, that it receives as input signals. The frequency offset is generated when the actual oscillation frequency (local carrier wave) of the local oscillator (or beat-frequency oscillator) of a receiver and the frequency of the received carrier wave do not coincide. The frequency offset information V(k) is supplied through a loop filter 18 to a control input of the VCO 19, which generates the first and second local carrier waves according to the input frequency offset information. The first and second local carrier waves have the same frequency and differ in phase by 90°, for generating the I- and Q-channel signals. The technology for detecting the above-described frequency offset information is discussed in "AFC Tracking Algorithms," IEEE Transactions on Communications, Vol. COM-32, No. 8, pp.935–947.

FIG. 2A shows a frequency detector using the cross product method for generating V(k) disclosed in the above reference. The I-channel signal $I_k$, which is sampled and digitized, is applied to a delay circuit (D) 21 and a multiplier 24, and the Q-channel signal $Q_k$, which is also sampled and digitized, is applied to a delay circuit 22 and a multiplier 23. The multiplier 23 multiplies the delayed I-channel signal by the input Q-channel signal, and the multiplier 24 multiplies the delayed Q-channel signal by the input I-channel signal. A subtractor 25 subtracts the output signal of multiplier 24 from the output signal of multiplier 23 and generates frequency offset information V(k) which is determined according to a sampling period $T_s$ and symbol period $T_b$.

That is, when sampling period $T_s$ is the same as symbol period $T_b$, i.e., $T_s=T_b$, the subtractor 25 generates frequency offset information V(k) in accordance with the following.

$$I_k = A\cos(\Delta\omega k T_s + \phi_k) \quad (1)$$

$$I_{k-1} = A\cos[\Delta\omega(k-1)T_s + \phi_{k-1}] \quad (2)$$

$$Q_k = A\sin(\Delta\omega k T_s + \phi_k) \quad (3)$$

$$Q_k = A\sin[\Delta\omega(k-1)T_s + \phi_{k-1}] \quad (4)$$

$$Q_k I_{k-1} = \frac{A^2}{2}\sin(\Delta\omega T_S + \phi_k - \phi_{k-1}) + \quad (5)$$

$$\frac{A^2}{2}\sin[\Delta\omega(2k-1)T_S + \phi_k + \phi_{k-1}]$$

$$I_k Q_{k-1} = \frac{-A^2}{2}\sin(\Delta\omega T_S + \phi_k - \phi_{k-1}) + \quad (6)$$

$$\frac{A^2}{2}\sin[\Delta\omega(2k-1)T_S + \phi_k + \phi_{k-1}]$$

$$\therefore V(k) = Q_k I_{k-1} - I_k Q_{k-1} \quad (7)$$

$$= A^2 \sin(\Delta\omega T_s + \theta_k)$$

Here, it is assumed that $\Delta\omega=\omega_1-\omega_0$, $\phi(t)=\phi_k$, $kT_s \leq t < (k+1)T_s$ and $\theta_k=\phi_k-\phi_{k-1}$.

On the other hand, when $T_s<T_b$ (over-sampling: $T_b=nT_s$, where n>1), frequency offset information V(k) generated from the subtractor 25 is expressed per the formula (20) which follows later on.

Here, when k is not equal to nl, then $$I_k = A\cos(\Delta\omega k T_s + \phi_l) \quad (8)$$

$$I_{k-1} = A\cos[\Delta\omega(k-1)T_s + \phi_l] \quad (9)$$

$$Q_k = A\sin(\Delta\omega k T_s + \phi_l) \quad (10)$$

$$Q_{k-1} = A\sin[\Delta\omega(k-1)T_s + \phi_l] \quad (11)$$

$$Q_k I_{k-1} = \frac{A^2}{2}\sin(\Delta\omega T_S) + \frac{A^2}{2}\sin[\Delta\omega(2k-1)T_S + 2\phi_l] \quad (12)$$

$$I_k Q_{k-1} = -\frac{A^2}{2}\sin(\Delta\omega T_S) + \frac{A^2}{2}\sin[\Delta\omega(2k-1)T_S + 2\phi_l] \quad (13)$$

-continued $$V(\therefore k) = Q_k I_{k-1} - I_k Q_{k-1}$$
$$= A^2 \sin(\Delta \omega T_s)$$

and when k is equal to nl, then $$I_k = A \cos(\Delta \omega k T_s + \phi_l) \quad (14)$$

$$I_{k-1} = A \cos[\Delta \omega (k-1) T_s + \phi_{l-1}] \quad (15)$$

$$Q_k = A \sin(\Delta \omega k T_s + \phi_l) \quad (16)$$

$$Q_{k-1} = A \sin[\Delta \omega (k-1) T_s + \phi_{l-1}] \quad (17)$$

$$Q_k I_{k-1} = \frac{A^2}{2} \sin(\Delta \omega T_s + \phi_l - \phi_{l-1} + \quad (18)$$
$$\frac{A^2}{2} \sin[\Delta \omega (2k-1) T_s + \phi_l + \phi_{l-1}]$$

$$I_k Q_{k-1} = -\frac{A^2}{2} \sin(\Delta \omega T_s + \phi_l - \phi_{l-1} + \quad (19)$$
$$\frac{A^2}{2} \sin[\Delta \omega (2k-1) T_s + \phi_l + \phi_{l-1}]$$

$$\therefore V(k) = Q_k I_{k-1} - I_k Q_{k-1}$$
$$= A^2 \sin(\Delta \omega T_s + \phi_l)$$

Therefore, $$V(k) = A^2 \sin(\Delta \omega T_s) \quad \text{for } k \neq nl \quad (20)$$
$$V(k) = A^2 \sin(\Delta \omega T_s + \phi_l) \quad \text{for } k = nl$$

wherein l=k/n and l is an integer not over [x]=x.

FIG. 2B shows a frequency detector that uses an arc tangent operation. An arc tangent portion 27 of the FIG. 2B frequency detector receives the signals ($Q_k$ and $I_k$) of two channels and performs the arc tangent operation, utilizing the Q-channel signal $Q_k$ as a numerator and the I-channel signal $I_k$ as a denominator. The output signal of arc tangent portion 27 is supplied to a differentiator 28 which generates frequency offset information V(k) expressed by formulas (21) and (22).

First, from formulas (1) and (3), F(k) is defined as follows when $$T_s = T_b:$$
$$F(k) = \tan^{-1}(Q_k/I_k) \quad (21)$$
$$= \Delta \omega k T_s + \phi_k$$
$$\therefore V(k) = F(k) - F(k-1)$$
$$= \Delta \omega (k - k + 1) T_s + (\phi_k - \phi_{k-1})$$
$$= \Delta \omega T_s + \theta_k$$

In the case of over-sampling and k≠nl, from formulas (8) and (10), one gets $$F(k) = \tan^{-1}(Q_k/I_k)$$
$$= \Delta \omega k T_s + \phi_l$$

and from formulas (9) and (11), one gets $$F(k-1) = \tan^{-1}(Q_{k-1}/I_{k-1})$$
$$= \Delta \omega (k-1) T_s + \phi_l$$
$$\therefore V(k) = F(k) - F(k-1)$$
$$= \Delta \omega T_s$$

On the other hand, in over-sampling where k=nl, from formulas (14) and (16), one gets $$F(k) = \tan^{-1}(Q_k/I_k)$$
$$= \Delta \omega k T_s + \phi_l$$

and from formulas (15) and (17), one gets $$F(k-1) = \tan^{-1}(Q_{k-1}/I_{k-1}) \quad (22)$$
$$= \Delta \omega (k-1) T_s + \phi_{l-1}$$
$$\therefore V(k) = F(k) - F(k-1)$$
$$= \Delta \omega T_s + \phi_l - \phi_{l-1}$$
$$= \Delta \omega T_s + \theta_l$$

Therefore, $$V(k) = \Delta \omega T_s \quad \text{for } k \neq nl$$
$$V(k) = \Delta \omega T_s + \phi_l \quad \text{for } k = nl$$

wherein l=k/n and l is an integer not over [x]=x.

The above formula (21) represents the output signal of differentiator 28 in the case where $T_s$ is equal to $T_b$, and formula (22) represents the output signal of differentiator 28 in the case of over-sampling, that is, $T_s < T_b$ and $T_b = nT_s$. Terms $\theta_k$ and $\theta_l$, the values of which vary according to the transmitted information, are excluded from the formula, in order to detect the exact frequency. Here, $\theta_k$ and $\theta_l$ represent the difference between the phase information transmitted from the current symbol period and the phase information transmitted from immediately preceding symbol period, that is, the phase difference between symbols during transmission. Hereinafter, $\theta_k$ is referred to as transmission phase information. A QPSK demodulator having a phase difference detector for performing an arc tangent operation as above and performing an AFC function is disclosed in European Patent Application No. 0 526 836 A2.

However, as shown in formulas (7) and (21), transmission phase information $\theta_k$ is included in the formula in the case where the sampling frequency is equal to the symbol rate. Thus, it is impossible to detect the exact frequency directly proportional to frequency offset $\Delta \omega$. Also, in the case of over-sampling, as shown in formulas (20) and (22), it is impossible to detect the exact frequency, since transmission phase information $\theta_l$ remains in a sample which undergoes symbol transition. Although the frequency detection performance can be improved by increasing the degree of over-sampling, the cost of hardware for over-sampling is increased for symbol rates above 20 MHz, as used in a direct broadcasting satellite. This problem can be also generated in a differentiator AFC circuit or a discrete Fourier transform AFC circuit.

Accordingly, the inventor sought an automatic frequency control method obtaining a reference phase which is the closest to the phase of a transmitted signal, using the quantization characteristic of the phase during transmission and the phase difference between the most current complex-number sample of the received MPSK signal and the complex-number sample a symbol period earlier, in effect sampling exactly at the Nyquist rate for symbols. The inventor also sought to develop an automatic frequency control apparatus suitable for performing that method.

SUMMARY OF THE INVENTION

The invention can be used in its more general aspects for the automatic frequency control of a modem using any type of MPSK modulation. The invention in certain of its more specific aspects concerns automatic frequency control of a modem using quarternary phase-shift keying (QPSK) modulation.

In an automatic frequency control method embodying an aspect of the invention, an MPSK-modulated signal is received, a frequency offset signal is generated using the phase information of the modulated signal, and the frequency of the local oscillator (or beat-frequency oscillator) of the receiver is controlled on the basis of the frequency offset signal. The method comprises the steps of: electronically obtaining contemporaneous samples of each of the results of synchronously demodulating the received MPSK signal in accordance with in-phase and quadrature phase carrier waves supplied from the local oscillator, the contemporaneous samples being obtained at a sampling frequency substantially equal to a multiple of the symbol frequency, which multiple is an integer at least one, each pair of the contemporaneous samples forming real and imaginary components of a complex-number sample; electronically generating a phase detection signal indicative of the difference in phase between each complex-number sample and a preceding complex-number sample one symbol period earlier; electronically determining which, of a plurality M in number of reference phase values $\psi_{i|i=1 \to M}$ of the M-ary phase-shift keying of the modulated signal used in the original transmission of the received MPSK signal, is closest to said difference in phase between each complex-number sample and the preceding complex-number sample one symbol period earlier, which closest reference phase is inferred to be the transmission phase information of the received MPSK signal; and electronically generating the frequency offset signal dependent on how much the difference in phase between each complex-number sample and the preceding complex-number sample one symbol period earlier departs from the transmission phase information determined therefrom.

An MPSK receiver constructed according to an aspect of the invention detects the frequency offset generated by the Doppler shift or by difference between the frequency of a carrier wave and the frequency of the local oscillator (or beat-frequency oscillator) of the receiver, using the transmission phase information and the phase difference information between the most current complex-number sample of the received MPSK signal and the complex-number sample of the received MPSK signal one symbol period earlier in the transmission. The detected frequency offset is used for automatic frequency control of the local oscillator. More particularly, this type of MPSK receiver comprises a sampling portion for supplying complex-number samples of a received MPSK signal at a predetermined sampling rate substantially equal to a multiple of the symbol frequency, which multiple is an integer at least one; a phase difference detector for receiving the current complex-number samples, for temporarily storing each of these received complex-number samples, and for generating samples of a phase detection signal, each of which samples of the phase detection signal is indicative of differential phase between a complex-number sample of the sampled received signal and another complex-number sample of the sampled received signal one symbol period earlier in time; a bin comparator for phase receiving the samples of the phase detection signal, determining for each a closest reference phase among the reference phase values of the M-ary phase-shift keying of the modulated signal to be supplied as a sample of transmission phase information; and a frequency offset signal generator generating a frequency offset signal determined by the phase difference between corresponding samples of the phase difference information and the transmission phase information.

BRIEF DESCRIPTION OF THE DRAWING

FIG. 8 is a block diagram showing the frequency detector according to still another preferred embodiment of the invention in the case of QPSK.

DETAILED DESCRIPTION OF THE INVENTION

Figure 1:
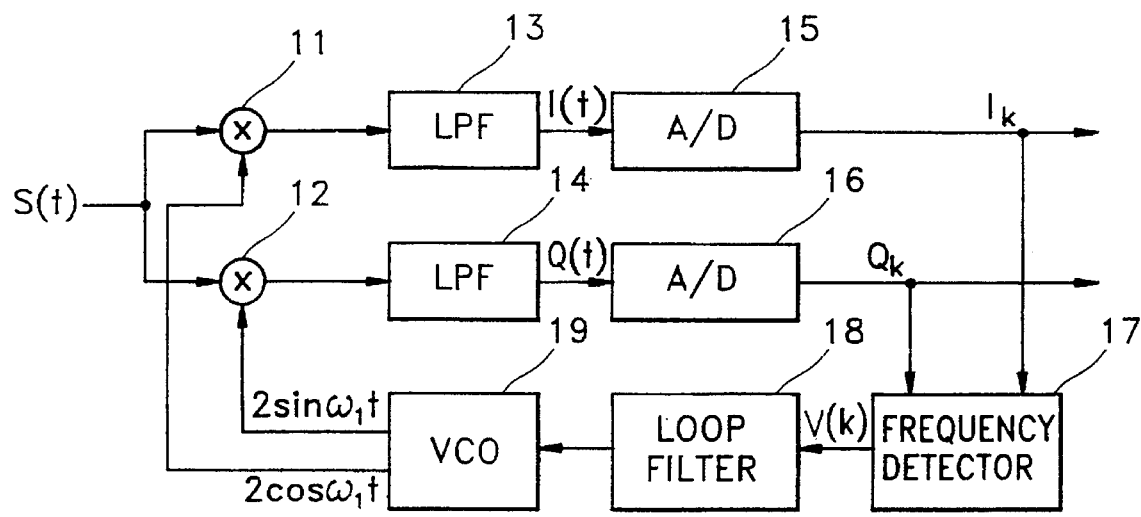
FIG. 1 is a block diagram showing a prior-art automatic frequency control apparatus for conventional QPSK demodulation.
Figure 2A:
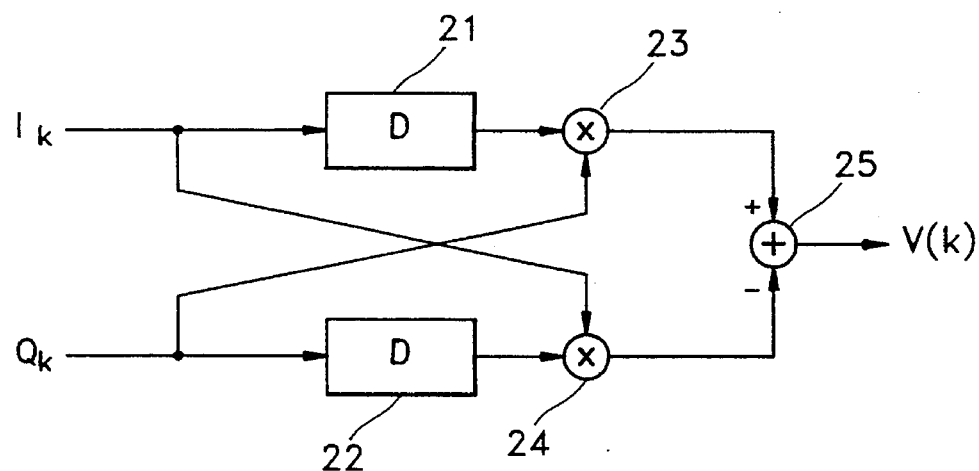
FIGS. 2A and 2B are block diagrams of a conventional frequency detector.
Figure 2B:
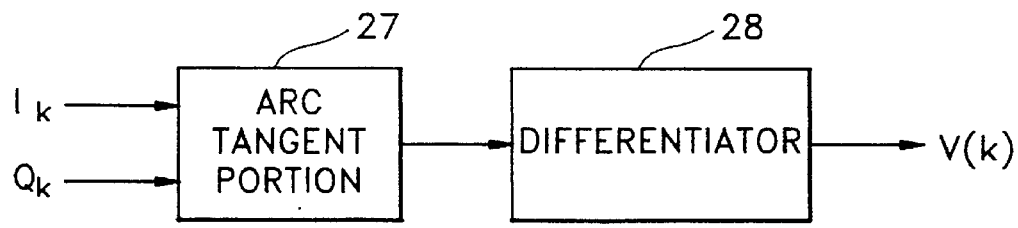

An automatic frequency control method will now be described with reference to FIG. 3. The transmitted signal is sampled at a symbol rate. If the sampling period is equal to the symbol period, the exact frequency is detected by eliminating the $\theta_k$ term through the assumption of the transmission phase information. That is, transmission phase information $\theta_k$ is assumed by determining a reference phase $\psi_i$ among a plurality of reference phases for transmitting information of the M-ary phase-shift keying as a reference phase. Here, the signal modulation using phase-shift keying varies transmission phase information $\theta_k$, in order to transmit information. Therefore, according to the invention, the frequency offset is detected so as to exactly perform the automatic frequency control by subtracting the assumed transmission phase information (reference phase) from the phase difference information between the currently sampled signal and the immediately preceding sampled signal. The automatic frequency control method will now be described in more detail.

If a signal modulated by M-ary phase-shift keying is transmitted, the receiver demodulates the received signal, and the automatic frequency control apparatus samples the input signal. The size $r_k'$ of a sampled signal $R_k$ exhibits variations due to noise. Since the sampled signal includes a frequency offset signal $\Delta\omega T$, the sampled signal $R_k$ can be expressed as the following formula (23).

$$R_k = I_k + jQ_k = r_k' e^{j(\phi_k + \Delta\omega t_k)}, \text{ where } T = T_s = T_b.$$

As shown in the following formula (24), if normalization is performed using the currently sampled signal $R_k$ and the immediately preceding sampled signal $R_{k-1}$, the resulting normalized signal has the phase difference information contained therein. Thus, the signal is called a phase detection signal $U_k$ which is obtained by compensating the magnitude of the signal distorted by noise.

$$U_k = \frac{R_k R_{k-1}^*}{|R_k| \times |R_{k-1}|} \quad (24)$$

$$= \frac{r'_k e^{j(\phi_k + \Delta\omega Tk)} r'_{k-1} e^{-j[\phi(k-1) + \Delta\omega T(k-1)]}}{r'_k r'_{k-1}}$$

$$= e^{j[\phi_k - \phi_{(k-1)} + \Delta\omega T]}$$

$$= e^{j(\theta_k + \Delta\omega T)}$$

$$\equiv C_k + j S_k$$

As shown in formula (24), phase difference signal $\angle U_k$ of phase detection signal $U_k$ always satisfies the following formulas (25) and (26), if the received MPSK signal is sampled so as to avoid intersymbol interference.

$$\angle U_k = \theta_k + \Delta\omega T \quad (25)$$

$$\Delta\omega T = \angle U_k - \theta_k \quad (26)$$

Sampled signal $R_k$ is the received signal, and phase detection signal $U_k$ can be calculated by the above formula (24). Therefore, if transmission phase information $\theta_k$, which is varied according to the transmitted phase information $\theta_k$, which is varied according to the transmitted information, is known, frequency offset signal $\Delta\omega T$ can be calculated exactly.

Transmission phase information $\theta_k$ is varied by transmission information and such variation itself is used as transmission information in the case of differential encoding. However, if the frequency control apparatus does not operate continually, the receiver cannot exactly determine the transmission phase information. To solve the problem, the frequency offset can be detected by transmitting the reference phase information in a constant symbol interval. However, this method is inefficient in terms of signal transmission.

Therefore, as an aspect of the invention, the following method is suggested. Transmission phase information $\theta_k$, which is not a continuous value, is quantized by the reference phase of M-ary phase-shift keying, and is transmitted. At the transmitter, transmission phase information $\theta_k$ is quantized to have reference phase values as shown in formula (27) below.

$$\theta_k \in \left\{ \psi_i | \psi_i = 0, \pm \frac{2}{M}\pi, \pm \frac{4}{M}\pi, \right. \quad (27)$$

$$\left. \pm \frac{6}{M}\pi, \ldots \pm \frac{M-2}{M}\pi, \pi \right\}$$

Therefore, at the receiver the phase difference between the symbols can be detected from the sampled signal and the reference phase signal which is the closest to each of the above transmission phase information values can be detected, even when a frequency offset exists.

Figure 3:
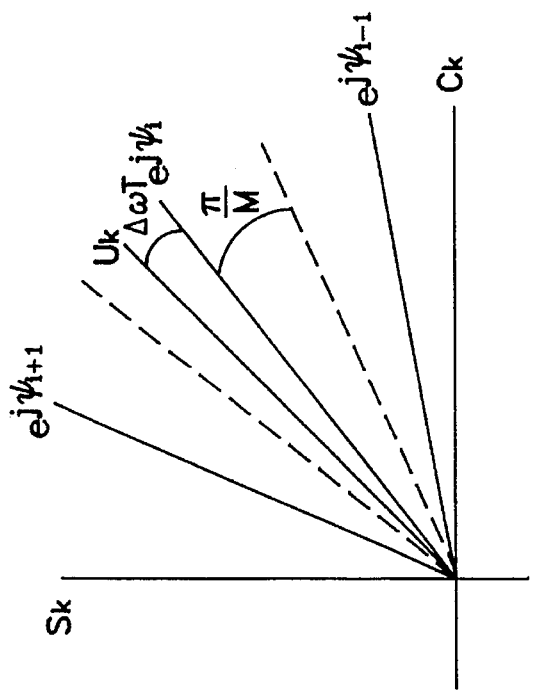
FIG. 3 is a diagram showing the relation between transmission phase information and a reference phase signal according to the invention.

FIG. 3 schematically shows the relation between the transmission phase information and the reference phase signal that is exploited in the invention. Each reference phase signal $e^{j\psi_i}$ is in the center of a respective phase range between a respective pair of boundaries (shown in dotted line). In the case where the range for selecting the reference phase signal which is the closest to transmission phase information $\theta_k$ is determined according to the following formula (28), it is determined that reference phase signal $e^{j\psi_i}$ and transmission phase information $\theta_k$ within the range have the same information.

$$-\pi/M < \Delta\omega T < \pi/M \quad (28)$$

Therefore, when automatic frequency control apparatus according to an aspect of the invention determines that the detected phase detection signal $U_k$ falls between the boundary lines that flank a particular reference phase signal $e^{j\psi_i}$, it decides that the transmission phase information $\theta_k$ is supposed to have the value $e^{j\psi_i}$.

A parameter M of the above formula (28) has the same value as the number of reference phase signal $e^{j\psi_i}$ for phase-shift keying. If reference phase signal $e^{j\psi_i}$ regarded as transmission phase information θk is determined, frequency offset signal $\Delta\omega T$ having the relation shown in the above formula (25) or (26) is calculated by the following formula (30) or (31).

Frequency offset signal $\Delta\omega T$ is obtained using the expression (29) for obtaining the sine of the angle between two complex numbers A and B.

$$Im\left[\frac{AB^*}{|A||B|}\right] \quad (29)$$

In equation (29) |A| and |B| are the magnitudes of the complex numbers A and B as expressed in Euler form. Each expression of reference phase, $e^{j\psi_i}$, has unit-value magnitude.

$$\sin(\Delta\omega T) = Im[U_k e^{-j\psi_i}]$$

$$= Im[(C_k + jS_k)e^{-j\psi_i}]$$

$$= Im[(C_k + jS_k) \times (\cos\psi_i - j\sin\psi_i)]$$

$$= S_k \cos\psi_i - C_k \sin\psi_i$$

So $\Delta\omega T \approx S_k \cos\psi_i - C_k \sin\psi_i \quad (30)$ or $\Delta\omega T = \sin^{-1}(S_k \cos\psi_i - C_k \sin\psi_i) \quad (31)$ Apparatus for detecting the frequency offset signal per formula (30) is simpler to construct and operate than apparatus for detecting the frequency offset signal per formula (31). The latter type of apparatus is better able to detect the frequency offset signal with negligible error, however.

Next, the apparatus for implementing the automatic frequency control method according to aspects of the invention will be described in detail, referring to FIGS. 4–6.

Figure 4:
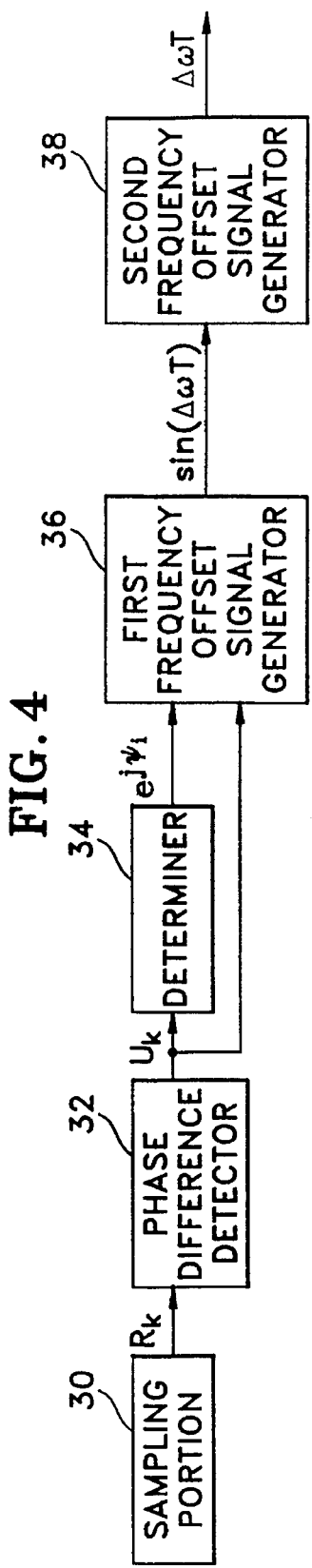
FIG. 4 is a block diagram showing a frequency detector according to a preferred embodiment of the invention.

FIG. 4 is a block diagram showing a frequency detector according to a preferred embodiment of the invention. The automatic frequency control apparatus shown in FIG. 4 comprises a sampling portion 30, a phase difference detector 32, a determiner 34, a first frequency offset signal generator 36, and a second frequency offset signal generator 38. The phase difference detector 32 may comprise a normalization circuit operating in accordance with the above formula (24) or, in cases where a large amount of calculation is needed, a complex conjugation operator employing the formula $U_k' = R_k R_{k-1}^*$. Now, the operation of the apparatus shown in FIG. 4 will be described.

Sampling portion 30 supplies complex-number samples of the signal which is received and demodulated to a phase difference detector 32. Responsive to the complex-number samples of the sampled signal $R_k$ being supplied thereto, the phase difference detector 32 generates a phase detection signal $U_k$ or $U'_k$ using the currently sampled signal $R_k$ and the immediately preceding sampled signal $R_{k-1}$ temporarily stored therein. Normalization means or complex conjugation operator means selected by an external control signal (not shown) generates the phase detection signal supplied from the phase difference detector 32. The phase detection signal generated by the phase difference detector 32 is applied both to a determiner 34 and to a first frequency offset signal generator 36. Since the same operation is performed in response to either of the phase detection signals $U_k$ and $U'_k$ which can be alternatively used, only signal processing in response to phase detection signal $U_k$ will be specifically described.

The determiner 34 is a bin comparator for phase, which determines transmission phase information $\theta_k$ by comparing each sample of the phase detection signal to reference or critical values stored therein. That is, the reference phase which is the closest to phase difference information $\angle U_k$ included in phase detection signal $U_k$, among the reference phase values which the received signal may have, is determined to be the transmission phase information $\theta_k$ of the modulated signal. Thus, the determiner 34 supplies reference phase signal $e^{j\psi_i}$ having the transmission phase information. The first frequency offset signal generator 36 receives the phase detection signal $U_k$ and reference phase signal $e^{j\psi_i}$ and generates first frequency offset signal $\sin(\Delta\omega T)$.

The first frequency offset signal generator 36 operates according to the formula (30) above and generates the imaginary component of the complex product of the input reference phase signal $e^{j\psi_i}$ and phase detection signal $U_k$. In certain practical circuits, the first frequency offset signal generator 36 operating according to the expression $S_k \cos\psi_i - C_k \sin\psi_i$ respectively digitally multiplies real and imaginary number components $C_k$ and $S_k$ of the phase detection signal $U_k$ by $\sin\psi_i$ and $\cos\psi_i$ values supplied from look-up tables in read-only memory that is addressed by the reference phase information $\psi_i$ from the determiner 34. In other practical circuits the respective product terms are supplied from respective look-up tables in read-only memory, one addressed by $S_k$ and $\psi_i$, the other by $C_k$ and $\psi_i$. In each of these types of practical circuit, the product terms $S_k \cos\psi_i$ and $C_k \sin\psi_i$ are then differentially combined by a digital subtractor.

The sampling portion 30, which supplies complex-number samples of the signal which is received and demodulated to the phase difference detector 32, includes means for synchronously demodulating the MPSK signal in two orthogonal phases and means for digitizing the results of both the in-phase synchronous demodulation result and the quadrature-phase synchronous demodulation result. The synchronous demodulation procedures can be completed in the analog domain, and the in-phase synchronous demodulation result and the quadrature-phase synchronous demodulation result can each be subsequently digitized by respective analog-to-digital converters as in the prior-art apparatus of FIG. 1. Alternatively, providing that the MPSK is on a carrier of low enough frequency, digitization of the MPSK-modulated carrier wave can be done prior to in-phase and quadrature-phase synchronous demodulation procedures that are carried out in the digital regime.

According to an aspect of the invention, the sampling frequency $f_s$ of the signal can be arranged to be the same as symbol rate $T_b$, so as to reduce the complexity and cost of the automatic frequency control of the local oscillator. Furthermore, where digitization of the MPSK-modulated carrier wave is done prior to in-phase and quadrature-phase synchronous demodulation procedures, those in-phase and quadrature-phase synchronous demodulation procedures are simply carried out by alternately selecting digital samples as belonging to the in-phase synchronous demodulation result and as belonging to the quadrature-phase synchronous demodulation result.

In some embodiments of the invention in which the sampling frequency $f_s$ of the signal is arranged to be the same as symbol rate $T_b$, the synchronous demodulation procedures to obtain I(t) and Q(t) signals are performed in the analog domain, and the in-phase synchronous demodulation result and the quadrature-phase synchronous demodulation result are furnished in analog form to a phase difference detector 32 that operates in the analog domain up to the point where the phase detection signal $U_k$ is determined. Detection of where transitions occur in the phase detection signal $U_k$ allows the synchronization of symbol clocking circuitry that defines the symbol period, so that sampling of the phase detection signal $U_k$ can be done near the middle of each symbol period for digitization with close to minimal intersymbol interference.

In other embodiments of the invention the sampling frequency $f_s$ of the signal is arranged to be a multiple more than one of the symbol rate $T_b$. Synchronous demodulation to obtain I(t) and Q(t) signals is carried out either in the analog regime, before digitization, or in the digital regime at the sampling rate that is a multiple more than one of the symbol rate $T_b$. Either procedure permits a preliminary calculation of phase change to be made between adjacent samples to detect the times at which phase changes occur because of symbol change and to infer all the symbol periods from that detected information. The samples are then applied to a subsampling filter that has its finite-impulse-response kernel placed at the middle of each sample period and that supplies its response at a sample rate equal to the symbol rate $T_b$, to be used as the basis for generating the first frequency offset signal. Procedures of this type reduce the possibility of intersymbol interference and can reduce noise. Variants of these procedures that use poly-phase filtering are also possible.

Where the received MPSK signal is of binary phase-shift keying (BPSK) type, the sampling frequency $f_s$ of the signal is preferably an even multiple of the symbol rate $T_b$, and must be at least twice the symbol rate $T_b$ in order that both I(t) and Q(t) signals can be detected.

As shown in FIG. 4, the first frequency offset signal $\sin(\Delta\omega T)$ supplied from the first frequency offset generator 36 can be supplied to a second frequency offset generator 38, which responds to supply the arc sine value of the input first frequency offset signal $\sin(\Delta\omega T)$. That is, a second frequency offset signal $\Delta\omega T$ is generated by the second frequency offset generator 38. Alternatively, either the output signal of the first frequency offset signal generator 36 or the output signal of the second frequency offset signal generator 38 can be used as frequency offset information for controlling the generation of a local oscillation signal.

Figure 5:
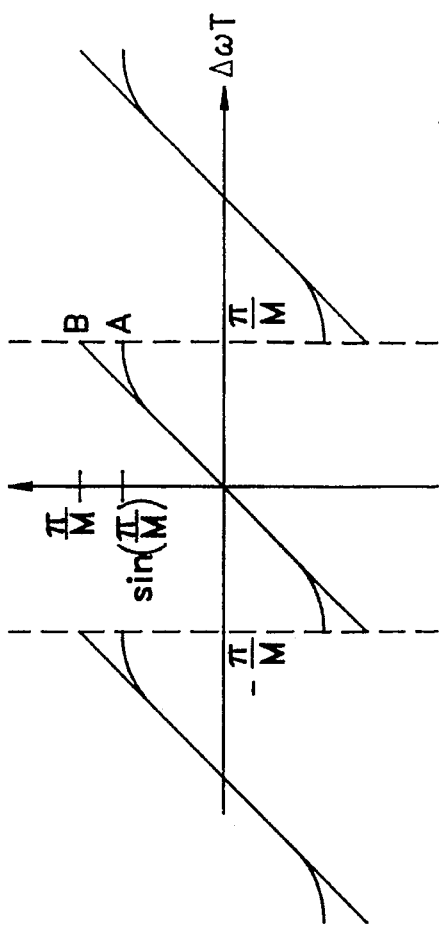
FIG. 5 is a discriminator curve showing the frequency offset.

FIG. 5 graphically shows respective frequency offset information generated by each of the frequency offset signal generators 36 and 38. The characteristic curve of FIG. 5 is obtained by a discriminator for the conditions where $|\Delta\omega T|$ is less than $\pi/M$, $|\Delta f|$ is less than $f_s/2M$, and $f_s$ is equal to $1/T_b$. Curves A and B of FIG. 5, obtained by the discriminator, are formed by the first frequency offset signal generator 36 and the second frequency offset signal generator 38, respectively. The first frequency offset signal generator 36 generates discriminator curve A the non-linearity of which becomes more pronounced near boundaries $-\pi/M$ and $\pi/M$. If the non-linear discriminator curve A is fairly uniform in slope in central portions between those boundaries, this amount of linearity will usually suffice; and it is unnecessary to have the better linearity of curve B. Thus, the output signal of the first frequency offset signal generator 36 can be used as frequency offset information in practical apparatus, allowing the second frequency offset signal generator 38 to be dispensed with. If the second frequency offset signal generator 38 is used, the frequency offset information can be detected with greater accuracy, but this is at the cost of an increase in the amount of required calculation.

Figure 6B:
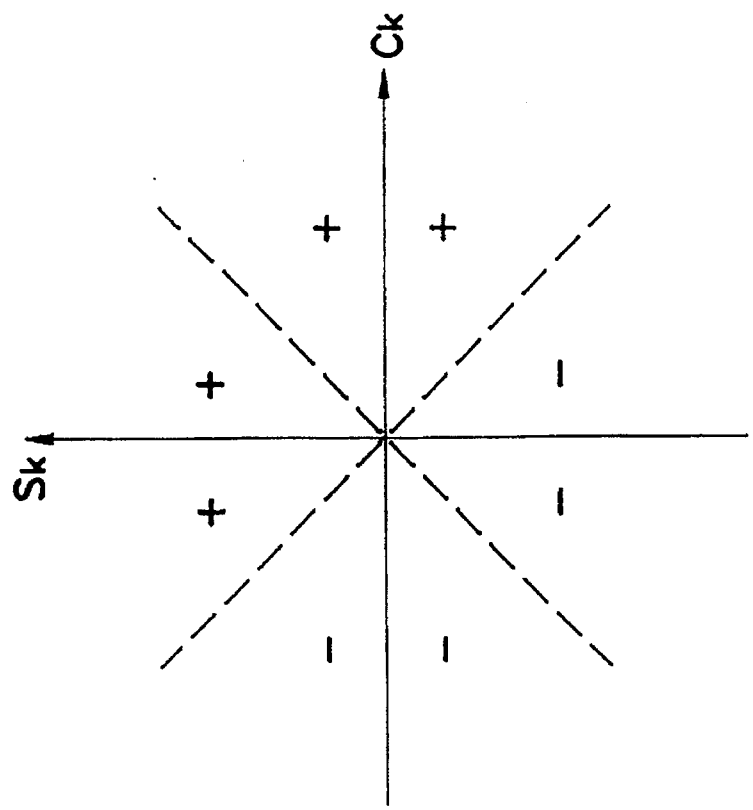
FIGS. 6A and 6B are diagrams for illustrating how the transmission phase information is determined by the real and imaginary number components of the phase detection signal in the case of QPSK.
Figure 6A:
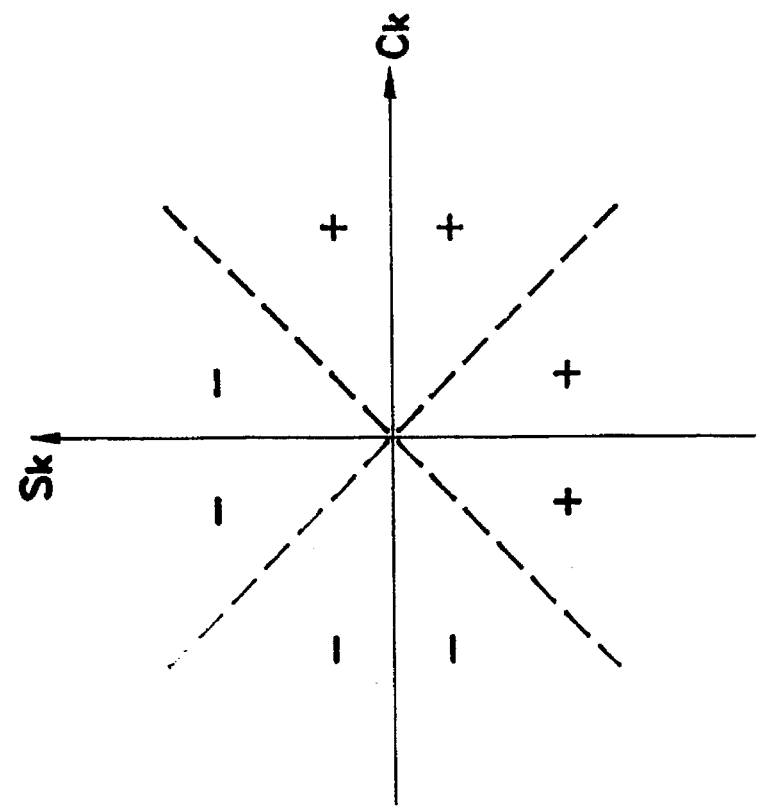
Figure 7:
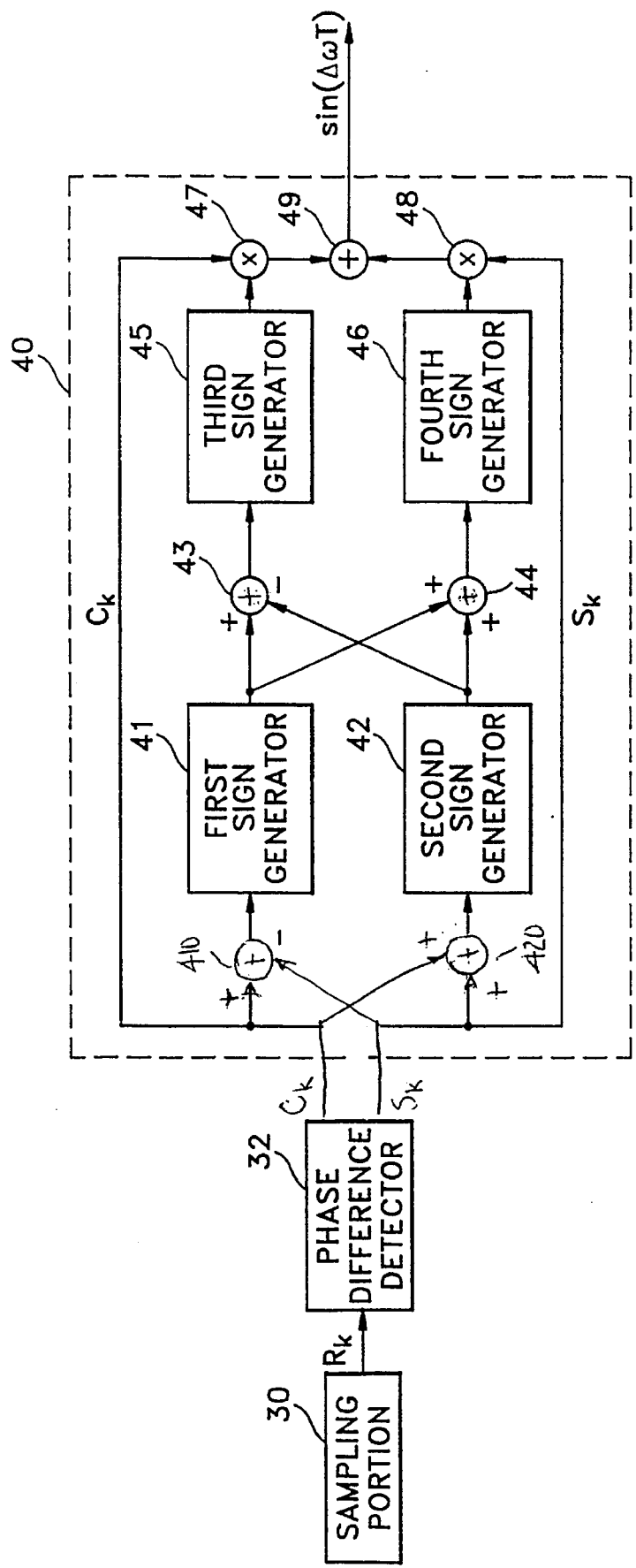
FIG. 7 is a block diagram showing the frequency detector according to another preferred embodiment of the invention in the case of QPSK.

FIGS. 6–8 show the special case where the automatic frequency control method that is an aspect of the invention is applied to QPSK modulation. In QPSK modulation, the value of parameter M is four and reference phases $\psi_0$, $\psi_1$, $\psi_2$ and $\psi_3$ are 0, $\pi/2$, $\pi$ and $-\pi/2$, respectively, according to formula (27).

The sum or difference between the real and imaginary number components $C_k$ and $S_k$ of phase detection signal $U_k$ has the relation shown in FIGS. 6A and 6B. FIG. 6A represents sgn($C_k-S_k$) and FIG. 6B represents sgn($C_k+S_k$). The sum or difference between the real and imaginary number components $C_k$ and $S_k$ is determined as one of the regions divided by the coordinate axis and dotted diagonal lines, according to the sign function.

The sign function is defined as follows.

sgn(x)=1 for x>0
sgn(x)=0 for x=0
sgn(x)=−1 for x<0

Reference phase information $\psi_i$ simultaneously corresponding to the regions determined in FIGS. 6A and 6B is transmission phase information $\theta_k$. These relations are summarized as follows:

(a) if $C_k-S_k>0$ and $C_k+S_k>0$, then $\psi_i=0$;
(b) if $C_k-S_k<0$ and $C_k+S_k>0$, then $\psi_i=\pi/2$;
(c) if $C_k-S_k<0$ and $C_k+S_k<0$, then $\psi_i=\pi$; and
(d) if $C_k-S_k>0$ and $C_k+S_k<0$, then, $\psi_i=-\pi/2$.

Frequency offset signal $\Delta\omega T$ is determined by the reference phase determined by the above relations and formula (30). That is, if $\psi_i$ is equal to zero, sin($\Delta\omega T$) is equal to $S_k$;
if $\psi_i$ is equal to $\pi/2$, sin($\Delta\omega T$) is equal to $-C_k$;
if $\psi_i$ is equal to $\pi$, sin($\Delta\omega T$) is equal to $-S_k$; and
if $\psi_i$ is equal to $-\pi/2$, sin($\Delta\omega T$) is equal to $C_k$.

Summarizing the above, the following formula (32) is formed.

$$\sin(\Delta\omega T)=C_k\text{sgn}[\text{sgn}(C_k-S_k)-\text{sgn}(C_k+S_k)]+S_k\text{sgn}[\text{sgn}(C_k-S_k)+\text{sgn}(C_k+S_k)] \qquad (32)$$

FIG. 7 is a block diagram showing the frequency detector according to another preferred embodiment of the invention. The apparatus of FIG. 7 comprises a sampling portion 30, a phase difference detector 32, and a frequency offset signal generator 40 employing formula (32) regarding the QPSK method. Frequency offset signal generator 40 comprises sign generators 41, 42, 45 and 46; subtractors 43 and 410; adders 44, 49 and 420; and multipliers 47 and 48. These constituent components are connected for performing operations on the signed amplitudes $C_k$ and $S_k$ of the real and imaginary portions of the phase difference detector 32 output signal $U_k$ according to formula (32) above. In FIG. 7, the second frequency offset signal generator 38 (FIG. 4) may be additionally connected to the output of frequency offset signal generator 40.

The operation of the apparatus shown in FIG. 7 will now be described. Sampling portion 30 supplies signal $R_k$ sampled at the sampling frequency which is the same as the symbol rate. Phase difference detector 32 performs the same operation as that of the block illustrated in FIG. 4.

The real number component signal $C_k$ and the imaginary number component signal $S_k$ that constitute the phase difference detector 32 output signal $U_k$ are differentially combined in the first subtractor 410 for application to the first sign generator 41. The first sign generator 41 supplies, as the first sign signal, the value of the sign function with respect to the difference ($C_k-S_k$) between the real number component signal $C_k$ and the imaginary number component signal $S_k$. The real number component signal $C_k$ and the imaginary number component signal $S_k$ are summed in the first adder 420 for application to the second sign generator 42. The second sign generator 42 supplies, as the second sign signal, the value of the sign function with respect to the sum ($C_k+S_k$) of the real number component signal $C_k$ and the imaginary number component signal $S_k$ that constitute $U_k$. Also, the real number component signal $C_k$ is applied to the first multiplier 47 as its multiplicand input signal, and the imaginary number component signal $S_k$ is applied to the second multiplier 48 as its multiplicand input signal.

The second subtractor 43, to which the first and second sign signals are applied, subtracts the second sign signal from the first sign signal and supplies the result to the first multiplier 47 as its multiplier input signal. The second adder 44 receives the first and second sign signals, adds them together and supplies the result. The third sign generator 45 supplies the result value of the sign function with respect to the output of the second subtractor 43 as the third sign signal. The fourth sign generator 46 supplies the result value of the sign function with respect to the output of the second adder 44 as the fourth sign signal.

First multiplier 47 multiplies the third sign signal by real number component signal $C_k$ and supplies the result to the third adder 49 as a first summand input signal. Second multiplier 48 multiplies the fourth sign signal by imaginary component signal $S_k$ and supplies the result to the third adder 49 as a second summand input signal. The third adder 49 sums its first and second summand input signals to generate the first frequency offset signal sin($\Delta\omega T$).

FIG. 8 is a block diagram showing the frequency detector according to still another preferred embodiment of the invention. The apparatus of FIG. 8 comprises a sampling portion 30, a phase difference detector 32, and a frequency offset signal generator 50 employing formula (32) regarding the QPSK method.

In frequency offset signal generator 50, a control signal generator 51 receives phase detection signal $U_k$, signal inverters 52 and 53 invert the signal component $C_k$ or $S_k$ supplied from phase difference detector 32 and supplies the inverted signals, and a multiplexer 54 selects the signals input according to the selection control signal (SEL) generated by control signal generator 51 and supplies the result as the first frequency offset signal sin($\Delta\omega T$). In FIG. 8, second frequency offset signal generator 38 (FIG. 4) may be additionally connected to the output of frequency offset signal generator 50.

The operation of the apparatus shown in FIG. 8 will now be described. When sampling portion 30 supplies signal $R_k$ sampled at the sampling frequency which is the same as the symbol rate, phase difference detector 32 performs the same operation as that of the block illustrated in FIG. 4.

The real number component signal $C_k$ of phase detection signal $U_k$ is inverted by first signal inverter 52 and imaginary number component signal $S_k$ is inverted by second signal inverter 53.

Control signal generator 51 is constructed for generating the selection control signal (SEL) that will implement selection in accordance with the above formula (32). That is, the selection control signal is the sign signal of two bits representing the logical product of sgn($C_k-S_k$) and sgn($C_k+S_k$).

Multiplexer 54 selects one signal among the four signals $S_k$, $-S_k$, $C_k$ and $-C_k$ as commanded by the selection control signal and supplies the selected signal. The signal output from multiplexer 54 is the first frequency offset signal sin(ΔωT), which is $S_k$ if $C_k-S_k>0$ and $C_k+S_k>0$, is $-C_k$ if $C_k-S_k<0$ and $C_k+S_k>0$, is $-S_k$ if $C_k-S_k<0$ and $C_k+S_k<0$, and is $C_k$ if $C_k-S_k>0$ and $C_k+S_k<0$.

The signal processor for generating frequency offset signal ΔωT in the preferred embodiments of FIGS. 7 and 8 has thus far not been described in detail. However, a second frequency offset signal generator 38 which responds to the frequency offset signal expressed as sin(ΔωT) to generate (ΔωT) is readily provided by a look-up table stored in read-only memory addressed by digital descriptions of sin(ΔωT) supplied by the first frequency offset signal generator 36, 40 or 50.

One skilled in the art of data communications receiver design will, by acquaintance with the foregoing specification and its drawing, be enabled to readily design various embodiments of the invention that are modifications of those specifically described and this should be borne in mind when construing the scope of the claims which follow. In those claims, the term "signal" refers to signals manifested in electric form, which can be digital electrical signals or can be sampled-data analog electrical signals, if not specifically indicated to be one or the other.

What is claimed is:

1. An automatic frequency control method for use in an MPSK signal receiver, in which said MPSK signal receiver a received MPSK signal is synchronously demodulated in accordance with in-phase and quadrature phase carrier waves supplied from a controlled oscillator, the frequency of the in-phase and quadrature phase carrier waves supplied from said controlled oscillator being controlled by a frequency offset signal generated using phase information from the received MPSK signal, said automatic frequency control method comprising the steps of:

electronically obtaining contemporaneous samples of each of the results of synchronously demodulating the received MPSK signal in accordance with in-phase and quadrature phase carrier waves supplied from said controlled oscillator, said contemporaneous samples being obtained at a sampling frequency substantially equal to a multiple of the received MPSK signal symbol frequency, which multiple is any integer at least one, each pair of said contemporaneous samples forming real and imaginary components of a complex-number sample;

electronically generating a phase detection signal indicative of the difference in phase between each complex-number sample and a preceding complex-number sample one symbol period earlier;

electronically determining which, of a plurality M in number of reference phase values $\psi_{i|i=1\to M}$ the M-ary phase-shift keying of said modulated signal used in the original transmission of the received MPSK signal, is closest to said difference in phase between each complex-number sample and the preceding complex-number sample one symbol period earlier, which closest reference phase is used as transmission phase information of said received MPSK signal; and electronically generating said frequency offset signal dependent on how much the difference in phase between each complex-number sample and the preceding complex-number sample one symbol period earlier departs from said transmission phase information determined therefrom.

2. An automatic frequency control method as claimed in claim 1, wherein said step of electronically generating a phase detection signal comprises substeps of:

electronically temporarily storing each complex-number sample $R_{k-1}$ as it is obtained, thereafter to provide the complex-number sample $R_{k-1}$ one symbol period earlier when the next complex-number sample $R_k$ is obtained; and electronically generating a first phase detection signal $U_k$ normalized against variation in MPSK amplitude in substantial accordance with the following equation:

$$U_k = \frac{R_k R_{k-1}^*}{|R_k| \times |R_{k-1}|}.$$

3. An automatic frequency control method as claimed in claim 1, wherein said step of electronically generating a phase detection signal comprises substeps of:

electronically temporarily storing each complex-number sample $R_{k-1}$ as it is obtained, thereafter to provide the complex-number sample $R_{k-1}$ one symbol period earlier when the next complex-number sample $R_k$ is obtained; and electronically performing a complex conjugation operation step to generate a second phase detection signal $U'_k$ in substantial accordance with the following equation:

$$U'_k = R_k R^*_{k-1}.$$

4. An automatic frequency control method as claimed in claim 2, wherein said step of electronically generating a frequency offset signal is one in which said frequency offset signal has a value sin(ΔωT) electronically generated in substantial accordance with the following equation:

$$\sin(\Delta\omega T) = Im[U_k e^{-j\psi_i}]$$

using said phase detection signal $U_k$ and said closest reference phase $\psi_i$.

5. An automatic frequency control method as claimed in claim 2, wherein step of electronically generating a frequency offset signal comprises:

a substep of electronically generating an address signal having a value sin(ΔωT)=Im$[U_k e^{-j\psi_i}]$ using said phase detection signal $U_k$ and said closest reference phase $\psi_i$; and a further substep of electronically generating said frequency offset signal with a value ΔωT by looking up from a table stored in read-only memory addressed by said address signal.

6. An automatic frequency control method as claimed in claim 5, wherein, in said step of electronically determining the transmission phase information of said received MPSK signal, when said phase difference information ∠$U_k$ of phase detection signal $U_k$ includes a second frequency offset signal ΔωT between −π/M and π/M determined according to the number M of the reference phase of the M-ary phase-shift keying, and when said phase difference information ∠$U_k$, second frequency offset signal ΔωT and transmission phase information $\theta_k$ satisfy ΔωT=∠$U_k$−$\theta_k$, a reference phase $\psi_i$ is determined as the reference phase which is the closest to said phase difference information.

7. An automatic frequency control apparatus for an MPSK receiver, in which a MPSK-modulated signal is received, a frequency offset signal is generated using the phase information of the modulated signal, and the oscillation frequency of a local oscillator used in detecting the received MPSK-modulated signal is controlled on the basis of the frequency offset signal, said automatic frequency control apparatus comprising:

a sampling portion of said MPSK receiver for supplying complex-number samples of the received MPSK signal at a predetermined sampling rate substantially equal to a multiple of its symbol frequency, which multiple is any integer at least one;

a phase difference detector for receiving the current complex-number samples of said sampled received MPSK signal from said sampling portion of said MPSK receiver, for temporarily storing each of these received complex-number samples, and for generating samples of a phase detection signal, each of which samples of said phase detection signal is indicative of differential phase between a complex-number sample of said sampled received signal and a complex-number sample of said sampled received signal one symbol period earlier in time;

a bin comparator for phase, receiving the samples of said phase detection signal and determining for each a closest reference phase among the reference phase values of the M-ary phase-shift keying of said modulated signal to be supplied as a sample of transmission phase information; and a frequency offset signal generator generating a frequency offset signal determined by the phase difference between corresponding samples of said phase detection signal and of said transmission phase information.

8. An automatic frequency control apparatus as claimed in claim 7, wherein said phase difference detector is of a type for generating said phase detection signal by a normalization procedure using the most current complex-number sample of said sampled received signal and a complex-number sample of said sampled received signal one symbol period earlier in time.

9. An automatic frequency control apparatus as claimed in claim 7, wherein said phase difference detector comprises a complex conjugation operator for generating said phase detection signal in response to the most current complex-number sample of said sampled received signal and a complex-number sample of said sampled received signal one symbol period earlier in time.

10. An automatic frequency control apparatus as claimed in claim 7, wherein said bin comparator for phase comprises:

determination circuitry for storing a plurality of critical values descriptive of phase ranges centered on respective ones of said reference phase values, receiving said phase detection signal and supplying as said transmission phase information the one of said reference phase values falling within the same range as said phase difference information of said phase detection signal; and a first frequency offset signal generator for receiving said transmission phase information and said phase detection signal and generating first frequency offset signal which is an imaginary number component of the result of a complex conjugation operation between the received transmission phase information and the phase detection signal.

11. An automatic frequency control apparatus as claimed in claim 10, wherein said first frequency offset generator receives said reference phase signal $e^{-j\psi_i}$ and said phase detection signal $U_k$ from said determination circuitry and generates a first frequency offset signal $\sin(\Delta\omega T)$ determined in substantial accordance with an equation as follows in this claim:

$$\sin(\Delta\omega T) = Im[U_k e^{-j\psi_i}]$$
$$= S_k\cos\psi_i - C_k\sin\psi_i.$$

12. An automatic frequency control apparatus as claimed in claim 11, further comprising a second frequency offset signal generator for receiving said first frequency offset signal $\sin(\Delta\omega T)$ and generating a second frequency offset signal $\Delta\omega T$ through an arc sine operation.

13. An automatic frequency control apparatus as claimed in claim 12, wherein, in said determination circuitry, when said phase difference information $\angle U_k$ of said phase detection signal $U_k$ includes a second frequency offset signal $\Delta\omega T$ between $-\pi/M$ and $\pi/M$ determined according to the number M of reference phase of phase-shift keying, and when said phase difference information $\angle U_k$, second frequency offset signal $\Delta\omega T$ and transmission phase information $\theta_k$ satisfy $\Delta\omega T = \angle U_k - \theta_k$, a reference phase $\psi_i$ is determined as the reference phase which is the closest to said phase difference information.

14. An automatic frequency control apparatus as claimed in claim 13, wherein said sampling portion of said MPSK receiver supplies said phase difference detector with complex-number samples of said received signal at a sampling frequency equal to the symbol rate.

15. An automatic frequency control apparatus for an MPSK receiver, in which a MPSK-modulated signal is received, a frequency offset signal is generated using the phase information of the modulated signal, and the oscillation frequency of a local oscillator used in detecting the received MPSK-modulated signal is controlled on the basis of the frequency offset signal, said automatic frequency control apparatus comprising:

a sampling portion of said MPSK receiver for supplying complex-number samples of the received MPSK signal at a predetermined sampling rate substantially equal to a multiple of its symbol frequency, which multiple is any integer at least one;

a phase difference detector for receiving the current complex-number samples of said sampled received MPSK signal from said sampling portion of said MPSK receiver, for temporarily storing each of these received complex-number samples, and for generating samples of a phase detection signal, each of which samples of said phase detection signal is indicative of differential phase between a complex-number sample of said sampled received signal and a complex-number sample of said sampled received signal one symbol period earlier in time;

a bin comparator for phase, receiving the samples of said phase detection signal and determining for each a closest reference phase among the reference phase values of the M-ary phase-shift keying of said modulated signal, to be supplied as a sample of transmission phase information; and a frequency offset signal generator generating a frequency offset signal determined by the phase difference between corresponding samples of said phase detection signal and of said transmission phase information, wherein said frequency offset signal generator comprises:

a first subtractor subtracting the amplitude of the imaginary component of said phase detection signal from the amplitude of the real component of said phase detection signal to generate a first difference signal;

a first sign generator for generating a first sign signal which is the value of a sign function with respect to said first difference signal;

a first adder adding the respective amplitudes of the real and imaginary components of said phase detection signal to generate a first sum signal;

a second sign generator for generating a second sign signal which is the value of a sign function with respect to said first sum signal;

a second subtractor subtracting said second sign signal from said first sign signal to generate a second difference signal;

a third sign generator for outputting a third sign signal which is the sign function value of the second difference signal;

a second adder for summing said first and second sign signals to generate a second sum signal;

a fourth sign generator for outputting a fourth sign signal which is the sign function value of the second sum signal;

a first multiplier for multiplying the real component of said phase detection signal by the third sign signal;

a second multiplier for multiplying the imaginary component of said phase detection signal by the fourth sign signal; and a third adder for summing the output signals of said first and second multipliers and generating said first frequency offset signal.

16. An automatic frequency control apparatus as claimed in claim 15, further comprising a second frequency offset signal generator for receiving said first frequency offset signal and generating a second frequency offset signal through an arc sine operation.

17. An automatic frequency control apparatus as claimed in claim 15, said sampling portion of said MPSK receiver supplies said phase difference detector with complex-number samples of said received signal at a sampling frequency equal to the symbol rate.

18. An automatic frequency control apparatus for an MPSK receiver, in which a MPSK-modulated signal is received, a first frequency offset signal is generated using the phase information of the modulated signal, and the oscillation frequency of a local oscillator used in detecting the received MPSK-modulated signal is controlled on the basis of the first frequency offset signal, said automatic frequency control apparatus comprising:

a sampling portion of said MPSK receiver for supplying complex-number samples of a received MPSK signal at a predetermined sampling rate substantially equal to a multiple of its symbol frequency, which multiple is any integer at least one;

a phase difference detector for receiving the current complex-number samples of said sampled received MPSK signal from said sampling portion of said MPSK receiver, for temporarily storing each of these received complex-number samples, and for generating samples of a phase detection signal, each of which samples of said phase detection signal is indicative of differential phase between a complex-number sample of said sampled received signal and a complex-number sample of said sampled received signal one symbol period earlier in time;

a bin comparator for phase, receiving the samples of said phase detection signal and determining for each a closest reference phase among the reference phase values of the M-ary phase-shift keying of said modulated signal to be supplied as a sample of transmission phase information; and a frequency offset signal generator generating a frequency offset signal determined by the phase difference between corresponding stunpies of said phase detection signal and of said transmission phase information, wherein said frequency offset signal generator comprises:

a control signal generator for receiving the QPSK-modulated phase detection signal and generating a selection control signal determined according to a first sign function value with respect to the difference obtained by subtracting the imaginary component of said phase detection signal from the real component of said phase detection signal and according to a second sign function value with respect to the sum of the real and imaginary components of said phase detection signal, said control signal generator generating said selection control signal so that the real component of said phase detection signal is selected as said first frequency offset signal if the first and second sign function values are greater than zero, the negative of the real component of said phase detection signal is selected as said first frequency offset signal if the first sign function value is less than zero and the second sign function value is greater than zero, the negative signal of the imaginary component of said phase detection signal is selected as said first frequency offset signal if the first and second sign function values are less than zero, and the imaginary component of said phase detection signal is selected as said first frequency offset signal if the first sign function value is greater than zero and the second sign function value is less than zero;

a first signal inverter for generating the negative of the real component of said phase detection signal, in response to the real component of said phase detection signal;

a second signal inverter for generating the negative of the imaginary component of said phase detection signal, in response to the imaginary component of said phase detection signal; and a multiplexer for selecting according to said selection control signal one of four input signals received thereby and supplying said selected signal as said first frequency offset signal, said multiplexer receiving as said four input signals thereto the real component of said phase detection signal, the imaginary component of said phase detection signal, the negative of the real component of said phase detection signal from said first signal inverter, and the negative of the imaginary component of said phase detection signal from said second signal inverter.

19. An automatic frequency control apparatus as claimed in claim 18, further comprising a second frequency offset signal generator for receiving said first frequency offset signal and generating a second frequency offset signal through an arc sine operation.

20. An automatic frequency control apparatus as claimed in claim 18, wherein said sampling portion of said MPSK receiver supplies said phase difference detector with complex-number samples of said received signal at a sampling frequency equal to the symbol rate.

* * * * *